US007283879B2

(12) United States Patent
Zeevi et al.

(10) Patent No.: US 7,283,879 B2

(45) Date of Patent: Oct. 16, 2007

(54) DYNAMIC NORMALIZATION OF SOUND REPRODUCTION

(75) Inventors: Daniel Zeevi, Or Yehuda (IL); Noam Levavi, Herzliya (IL)

(73) Assignee: YCD Multimedia Ltd., Herzliya (IL)

(*) Notice: Subject to any disclaimer, the term of this patent is extended or adjusted under 35 U.S.C. 154(b) by 625 days.

(21) Appl. No.: 10/384,954

(22) Filed: Mar. 10, 2003

(65) Prior Publication Data

US 2004/0005068 A1 Jan. 8, 2004

(30) Foreign Application Priority Data

Mar. 10, 2002 (IL) ..................................... 148592

(51) Int. Cl.

*G06F 17/00* (2006.01)
*H03G 3/00* (2006.01)
*H03G 7/00* (2006.01)
*H04R 29/00* (2006.01)
*H04B 1/00* (2006.01)

(52) U.S. Cl. ........................ 700/94; 381/104; 381/107; 381/56; 381/119

(58) Field of Classification Search ................ 381/104, 381/56, 119, 105, 106–109, 120, 121; 700/94
See application file for complete search history.

(56) References Cited

U.S. PATENT DOCUMENTS 3,789,143 A * 1/1974 Blackmer ................... 381/106
4,721,951 A 1/1988 Holler
4,881,123 A * 11/1989 Chapple ..................... 381/104
5,491,782 A 2/1996 King et al.
5,684,969 A 11/1997 Ishida
5,792,971 A * 8/1998 Timis et al. .................. 84/609
5,850,531 A 12/1998 Cox et al.
5,854,845 A * 12/1998 Itani ........................... 381/108

(Continued)

FOREIGN PATENT DOCUMENTS

| | | |
|---|---|---|
| GB | 2329808 | 3/1999 |
| JP | 10-173457 | 6/1998 |
| WO | WO97/10586 | 3/1997 |

OTHER PUBLICATIONS

Internet Screen Shots from www.32bit.com ("Active Skin", pp. 1-2, Apr. 1999).
"Window Blinds", Skin Utility, STARDOCK, one page. Printed from the World Wide Web on Jan. 12, 2000, (www.stardock.com).

(Continued)

*Primary Examiner*—Vivian Chin
*Assistant Examiner*—Douglas Suthers
(74) *Attorney, Agent, or Firm*—McDonnell Boehnen Hulbert & Berghoff LLP

(57) ABSTRACT

A method for generating an audio output from an audio amplifier, the method consisting of receiving a segment of an input audio data stream into a buffer, identifying an adjustment interval in the segment, and calculating an average energy of at least a section of the audio data in the buffer subsequent to the adjustment interval in the segment. The method further includes determining a constant amplification factor in response to the average energy and to a pre-set volume level of the audio output, outputting the audio data from the buffer to the audio amplifier, and, when the audio data output to the audio amplifier reaches the adjustment interval, adjusting the audio amplifier to apply the amplification factor to the audio data in at least the section subsequent to the adjustment interval.

30 Claims, 4 Drawing Sheets

U.S. PATENT DOCUMENTS

| | | | | |
|---|---|---|---|---|
| 5,874,966 | A | 2/1999 | Polimeni et al. | |
| 6,002,401 | A | 12/1999 | Baker | |
| 6,118,427 | A | 9/2000 | Buxton et al. | |
| 6,262,724 | B1 | 7/2001 | Crow et al. | |
| 6,300,947 | B1 | 10/2001 | Kanevsky | |
| 6,314,415 | B1 | 11/2001 | Mukherjee | |
| 6,392,671 | B1 | 5/2002 | Glaser | |
| 6,636,609 | B1 * | 10/2003 | Ha et al. | 381/104 |
| 6,707,476 | B1 | 3/2004 | Hochstedler | |
| 6,731,310 | B2 | 5/2004 | Craycroft et al. | |
| 6,791,581 | B2 | 9/2004 | Novak et al. | |

OTHER PUBLICATIONS

"Winamp", Skin Utility, NULLSOFT INC., 4 pages. Printed from the World Wide Web on Jan. 12, 2000, (www.winamp.com).

"ActiveSkin", Skin Utility, SOFTSHAPE 7 pages. Printed from the World Wide Web on Feb. 8, 2000, (www.softshape.com/activeskin).

http://www.whatis.com/skin.htm, one page, Sep. 20, 1999.

"The Quintessential CD QCD 2.0 Player", described in "Designing User Interfaces ('Skins') for the QCD 2.0 Player", 17 pages. (www.quinnware.com), 1999.

* cited by examiner

DYNAMIC NORMALIZATION OF SOUND REPRODUCTION

REFERENCE TO RELATED APPLICATIONS

This application claims priority to Israel Patent Application No. 148,592, filed Mar. 10, 2002 entitled "Dynamic Normalization of Sound Reproduction," which is incorporated by reference herein in its entirety.

FIELD OF THE INVENTION

The present invention relates generally to production of sound, and specifically to adjustment of the sound level at reproduction.

BACKGROUND OF THE INVENTION

Pre-recorded audio, for example, music, speech, combinations of music and speech such as may occur in advertisements, or other pre-recorded sound, is typically recorded at different sound levels. When playing back pre-recorded audio from different sources, such as occurs when two music tracks from different sources are played back consecutively, the sound volume that is produced by the equipment playing the audio differs according to the level of the original recording. In order to achieve a listening level that is approximately equal for both tracks, a volume control on the equipment must typically be adjusted. For each track, the adjustment can only be made as the track is played, and is normally made by an operator of the equipment adjusting the volume control manually, after a transition from a first to a second track has been made. The need for constantly adjusting the volume control is at the very least annoying.

In audio equipment that allows pre-recorded tracks to be mixed, it is desirable to maintain an approximately equal listening level during the transition, as the level of a first track is reduced and the level of a second track is increased. Because the two tracks will normally be recorded at different levels, both the rate of reduction and the rate of increase may have to be manually adjusted, by an operator of the mixing system as he/she listens to the mixed output, in order to produce an acceptable sound level. In addition, during mixing, constructive and destructive interference effects can significantly affect the final level of sound output from the mixing equipment. Thus, a system which can allow for sound levels to be maintained at a pre-set level, regardless of the track being played or of transitions between tracks, would be advantageous.

SUMMARY OF THE INVENTION

It is an object of some aspects of the present invention to provide a method for replaying of a pre-recorded audio source at a substantially pre-set volume level.

It is a further object of some aspects of the present invention to maintain the pre-set volume level during simultaneous replay of more than one pre-recorded audio source.

In preferred embodiments of the present invention, an audio playing system analyzes a pre-recorded audio data source, herein also termed a track, so as to play the track at a pre-set volume level. Initially, a system operator inputs the pre-set volume level as a level at which the operator wishes to hear the track. The system analyzes an initial segment of the track in a buffer to determine one or more adjustment intervals within the initial segment. An adjustment interval comprises an interval of the track wherein an amplification factor applied to data in the interval can be changed without causing a change in the output volume level that would be noticeable and bothersome to listeners. An average energy level of the initial segment is calculated from the audio data of the segment that does not include adjustment intervals. From the average energy level of the initial segment, and the pre-set volume level, the system determines an amplification factor which is applied, in an audio amplifier of the system, to the initial segment and to the remainder of the track in a look-ahead manner to generate the pre-set volume level. The volume level of the complete track is thus set to the pre-set volume level, with no need for manual input from the equipment operator, and with no volume level changes being apparent to the listener.

Subsequent track segments may be analyzed in the buffer, to determine one or more subsequent adjustment intervals and a cumulative average energy level of the track. The amplification factor evaluated from the initial segment may then be changed in a look-ahead manner according to variations in the cumulative average energy level, the change most preferably being applied in an adjustment interval.

In the case when two or more tracks are to be "mixed," i.e., played simultaneously by the system, each track is separately analyzed to determine its average energy level. As the two or more tracks are played, a varying amplification factor is applied to each of the tracks so that an overall volume output of the mixed tracks is substantially maintained at the pre-set volume level. Most preferably, the system analyzes the tracks, after mixing and before final output, to determine if constructive or destructive interference has occurred in the mixing. When interference does occur, adjustments that counteract the interference effects are made to the amplification factors.

There is therefore provided, according to a preferred embodiment of the present invention, a method for generating an audio output from an audio amplifier, the method including:

receiving a segment of an input audio data stream into a buffer;

identifying an adjustment interval in the segment;

calculating an average energy of at least a section of the audio data in the buffer subsequent to the adjustment interval in the segment;

determining a constant amplification factor in response to the average energy and to a pre-set volume level of the audio output;

outputting the audio data from the buffer to the audio amplifier; and when the audio data output to the audio amplifier reaches the adjustment interval, adjusting the audio amplifier to apply the amplification factor to the audio data in at least the section subsequent to the adjustment interval.

Preferably, the adjustment interval includes an interval of the input audio data stream wherein the amplification factor applied to data in the interval can be changed without causing a change in an output volume level from the audio amplifier that would be noticeable and bothersome to listeners.

The method preferably also includes calculating an unadjusted average energy of the segment, wherein the adjustment interval includes an interval of the input audio data stream of the segment having a pre-set value below the unadjusted average energy level.

The adjustment interval preferably includes an interval identified by an operator of the audio amplifier.

Preferably, calculating the average energy includes summing squares of amplitudes of the input audio data stream.

The method preferably also includes identifying one or more other adjustment intervals in the segment other than the adjustment interval, wherein calculating the average energy includes calculating the average energy of the input audio data stream in the segment absent values of the input audio data stream included in the adjustment interval and the one or more other adjustment intervals.

The method preferably also includes:

receiving one or more subsequent segments of the input audio data stream into the buffer;

calculating a cumulative average energy of the input audio data stream in response to the average energy of the at least the section and an energy of the one or more subsequent segments; and determining an adjustment to the constant amplification factor in response to the cumulative average energy.

Preferably, the method further includes identifying one or more other adjustment intervals in the one or more subsequent segments, wherein adjusting the audio amplifier includes, when the audio data output to the audio amplifier reaches the one or more other adjustment intervals, applying the adjustment to the constant amplification factor to the audio amplifier.

Preferably, applying the adjustment includes setting a predetermined limit to a variation from the pre-set volume level, and applying the adjustment in response to exceeding the limit.

Further preferably, setting the predetermined limit includes selecting a type of the input audio data stream from a group of types of audio data consisting of music, song, and speech, and setting a value of the predetermined limit in response to the type.

The method preferably also includes saving the average energy and a position of the adjustment interval in a memory, and reading the average energy and the position from the memory and generating a subsequent audio output from the audio amplifier in response to the average energy and the position read from the memory.

Preferably, the adjustment interval includes an interval at the beginning of the input audio data stream.

Preferably, the input audio data stream is generated by an audio source, and the audio output is provided to one or more loudspeakers, and at least one of the audio source and the one or more loudspeakers are coupled to the audio amplifier by a network.

There is further provided, according to a preferred embodiment of the present invention, a method for generating an audio output from an audio amplifier, the method including:

receiving a first segment of a first input audio data stream into a buffer;

identifying a first adjustment interval in the first segment;

calculating a first average energy of at least a section of the first audio data in the buffer subsequent to the first adjustment interval in the first segment;

determining a first constant amplification factor in response to the first average energy and to a pre-set volume level of the audio output;

outputting the first audio data from the buffer to the audio amplifier;

when the first audio data output to the audio amplifier reaches the first adjustment interval, adjusting the audio amplifier to apply the first amplification factor to the first audio data in at least the section subsequent to the first adjustment interval;

receiving a second segment of a second input audio data stream into the buffer;

identifying a second adjustment interval in the second segment;

calculating a second average energy of at least a section of the second audio data in the buffer subsequent to the second adjustment interval in the segment;

determining a second constant amplification factor in response to the second average energy and to the pre-set volume level;

outputting the second audio data from the buffer to the audio amplifier; and adjusting the audio amplifier to apply the first amplification factor to the first audio data and the second amplification factor to the second audio data so as to generate a mixed output of the first and the second audio data having a mixed level substantially equal to the pre-set volume level.

Preferably, adjusting the audio amplifier to apply the first amplification factor to the first audio data and the second amplification factor to the second audio data includes:

selecting a time interval in which to generate the mixed output;

setting a first mixing factor and a second mixing factor, for the first and second audio data stream respectively, in response to an elapsed time in the time interval; and multiplying the first amplification factor by the first mixing factor and multiplying the second amplification factor by the second mixing factor.

Preferably, adjusting the audio amplifier to apply the first amplification factor to the first audio data and the second amplification factor to the second audio data includes:

measuring the mixed level to determine an interference effect between the first audio data and the second audio data; and altering an overall gain of the audio amplifier to correct for the interference effect.

There is further provided, according to a preferred embodiment of the present invention, apparatus for generating an audio output from an audio amplifier, including:

a buffer which receives a segment of an input audio data stream; and a processor which is adapted to:

identify an adjustment interval in the segment, calculate an average energy of at least a section of the audio data in the buffer subsequent to the adjustment interval in the segment, determine a constant amplification factor in response to the average energy and to a pre-set volume level of the audio output, output the audio data from the buffer to the audio amplifier, and when the audio data output to the audio amplifier reaches the adjustment interval, adjust the audio amplifier to apply the amplification factor to the audio data in at least the section subsequent to the adjustment interval.

The adjustment interval preferably includes an interval of the input audio data stream wherein the amplification factor applied to data in the interval can be changed without causing a change in an output volume level from the audio amplifier that would be noticeable and bothersome to listeners.

The processor is preferably adapted to calculate an unadjusted average energy of the segment, and the adjustment interval preferably includes an interval of the input audio data stream of the segment having a pre-set value below the unadjusted average energy level.

Alternatively, the adjustment interval includes an interval identified by an operator of the audio amplifier.

Preferably, calculating the average energy includes summing squares of amplitudes of the input audio data stream.

The processor is preferably adapted to identify one or more other adjustment intervals in the segment other than the adjustment interval, and calculating the average energy preferably includes calculating the average energy of the input audio data stream in the segment absent values of the input audio data stream included in the adjustment interval and the one or more other adjustment intervals.

The buffer is preferably adapted to receive one or more subsequent segments of the input audio data stream, and the processor is preferably adapted to:

calculate a cumulative average energy of the input audio data stream in response to the average energy of the at least the section and an energy of the one or more subsequent segments, and determine an adjustment to the constant amplification factor in response to the cumulative average energy.

The processor is preferably further adapted to identify one or more other adjustment intervals in the one or more subsequent segments, and adjusting the audio amplifier preferably includes, when the audio data output to the audio amplifier reaches the one or more other adjustment intervals, applying the adjustment to the constant amplification factor to the audio amplifier.

Preferably, applying the adjustment includes setting a predetermined limit to a variation from the pre-set volume level, and applying the adjustment in response to exceeding the limit.

Preferably, setting the predetermined limit includes selecting a type of the input audio data stream from a group of types of audio data consisting of music, song, and speech, and setting a value of the predetermined limit in response to the type.

The apparatus preferably includes a memory to which the average energy and a position of the adjustment interval are saved, and the processor is preferably adapted to read the average energy and the position from the memory and to generate a subsequent audio output from the audio amplifier in response thereto.

Preferably, the adjustment interval includes an interval at the beginning of the input audio data stream.

The input audio data stream is preferably generated by an audio source, and the audio output is preferably provided to one or more loudspeakers, and at least one of the audio source and the one or more loudspeakers are preferably coupled to the audio amplifier by a network.

There is further provided, according to a preferred embodiment of the present invention, apparatus for generating an audio output from an audio amplifier, including:

a buffer which receives a first segment of a first input audio data stream; and a processor which is adapted to:

identify a first adjustment interval in the first segment, calculate a first average energy of at least a section of the first audio data in the buffer subsequent to the first adjustment interval in the first segment, determine a first constant amplification factor in response to the first average energy and to a pre-set volume level of the audio output, output the first audio data from the buffer to the audio amplifier, when the first audio data output to the audio amplifier reaches the first adjustment interval, adjust the audio amplifier to apply the first amplification factor to the first audio data in at least the section subsequent to the first adjustment interval, wherein the buffer is adapted to receive a second segment of a second input audio data stream, and wherein the processor is further adapted to:

identify a second adjustment interval in the second segment;

calculate a second average energy of at least a section of the second audio data in the buffer subsequent to the second adjustment interval in the segment, determine a second constant amplification factor in response to the second average energy and to the pre-set volume level, output the second audio data from the buffer to the audio amplifier, and adjust the audio amplifier to apply the first amplification factor to the first audio data and the second amplification factor to the second audio data so as to generate a mixed output of the first and the second audio data having a mixed level substantially equal to the pre-set volume level.

Adjusting the audio amplifier to apply the first amplification factor to the first audio data and the second amplification factor to the second audio data preferably includes:

selecting a time interval in which to generate the mixed output;

setting a first mixing factor and a second mixing factor, for the first and second audio data stream respectively, in response to an elapsed time in the time interval; and multiplying the first amplification factor by the first mixing factor and multiplying the second amplification factor by the second mixing factor.

Preferably, adjusting the audio amplifier to apply the first amplification factor to the first audio data and the second amplification factor to the second audio data includes:

measuring the mixed level to determine an interference effect between the first audio data and the second audio data; and altering an overall gain of the audio amplifier to correct for the interference effect.

The present invention will be more fully understood from the following detailed description of the preferred embodiments thereof, taken together with the drawings, a brief description of which follows.

DETAILED DESCRIPTION OF PREFERRED EMBODIMENTS

Figure 1:
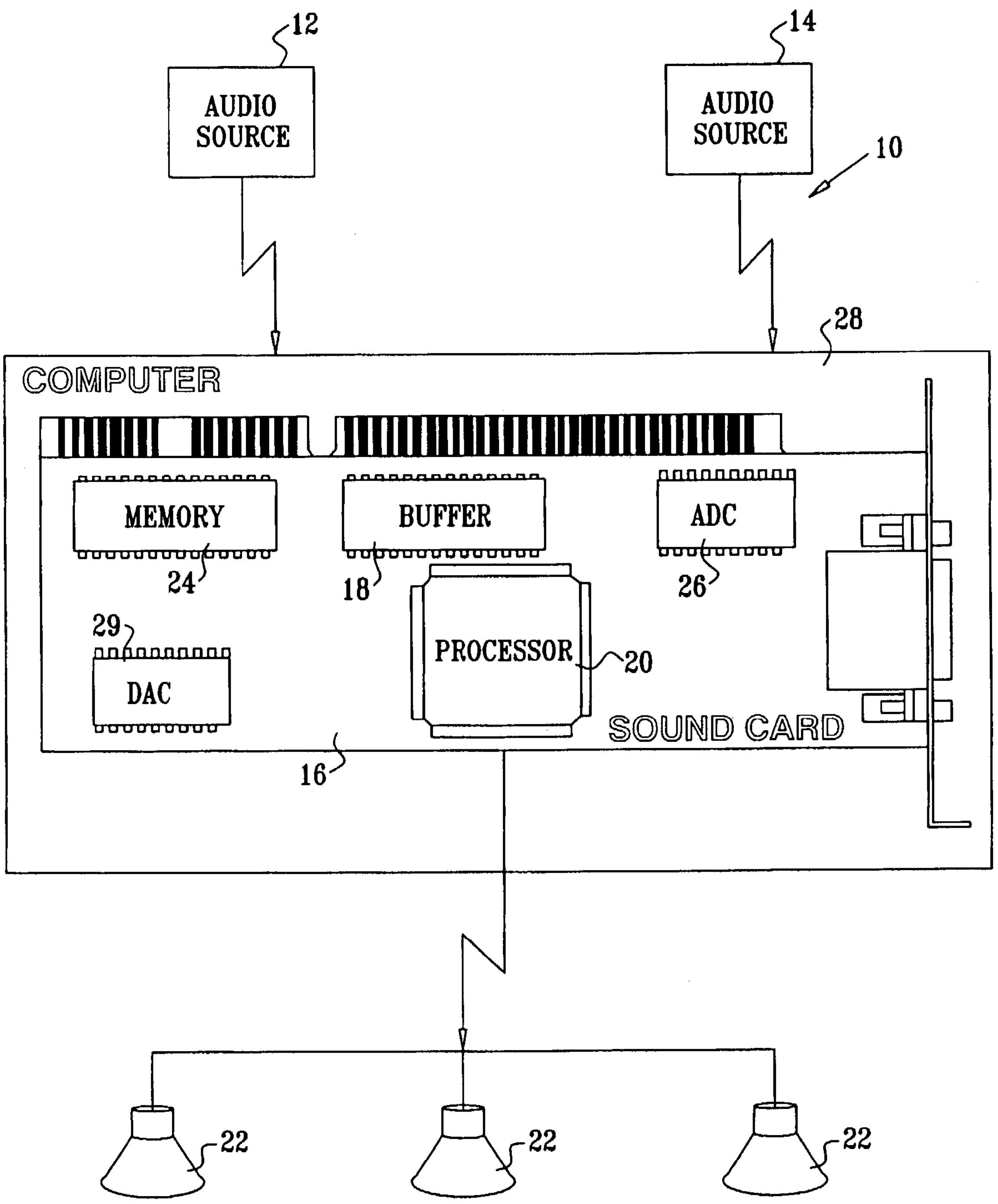
FIG. 1 is a schematic diagram illustrating a sound system, according to a preferred embodiment of the present invention.

Reference is now made to FIG. 1, which is a schematic diagram illustrating a sound system 10, according to a preferred embodiment of the present invention. System 10 comprises a sound card 16, which operates as an audio amplifier and which is able to receive audio data from a variety of audio sources known in the art, such as compact discs (CDs), tapes, and audio files. The sources may comprise one or more digital audio sources (DASs), such as CDs, or one or more analog audio sources, such as analog tapes. The sources may be directly coupled to sound card 16, by cabling such as fiber optic or conductive cables. Alternatively, the sources may be coupled indirectly to sound card 16, such as via a network or wireless relay, wherein the sources are at a first node of the network or relay, and the sound card is at a second node of the network/relay. It will be understood that, especially in the case of audio received via a network such as the Internet, each audio source may comprise one or more audio data generators, the data from which may be combined before, or on arrival at, sound card 16. Such audio sources include, but are not limited to, generators of streaming audio data.

Sound card 16 comprises an analog-to-digital converter (ADC) 26 which is able to convert analog input to the card to digital data, and a digital-to-analog converter (DAC) 29, which outputs analog audio signals from the sound card, after the digital data has been processed by the card. Sound card 16 most preferably comprises an off-the-shelf sound card which operates as a linear or a logarithmic audio amplifier. Alternatively, sound card 16 comprises a custom or a semi-custom sound card, or a sound card made from custom or semi-custom components, that is able to process audio data. Preferably, sound card 16 is installed in a computer 28 included in system 10; alternatively, sound system 10 is a generally stand-alone system.

Sound card 16 preferably also comprises a processor 20, a buffer 18, and a memory 24. Alternatively, when sound card 16 is installed in computer 28, at least some of processor 20, buffer 18, and memory 24, and/or all or part of their functions, may be comprised in elements of the computer. At least some of processor 20, buffer 18, and memory 24 may be added to sound card 16 by means known in the art, such as incorporating the processor, buffer, and/or memory, or parts thereof, into a daughter board which connects to the sound card.

System 10 comprises one or more loudspeakers 22 receive which receive the analog audio signals generated by sound card 16. As for the coupling between sound card 16 and the audio sources, coupling between loudspeakers 22 and sound card 16 may be direct via cabling or indirect, such as via a network and/or a wireless relay. For example, loudspeakers 22 may comprise speakers coupled to sound card 16 via a wired bus such as a Universal Serial Bus (USB) and/or via a wireless protocol such as a Bluetooth protocol. In a preferred embodiment of the present invention, sound card 16 is coupled indirectly, via the Internet, to the audio sources and to loudspeakers 22, both the sources and the loudspeakers being physically remote from the sound card, the sound card being adapted to receive streaming audio from the audio sources. By way of example, in the following description system 10 is assumed to be able to receive digital audio data from a first DAS 12 and a second DAS 14, although it will be appreciated that the system may receive audio data from any of the audio sources described above.

Figure 2:
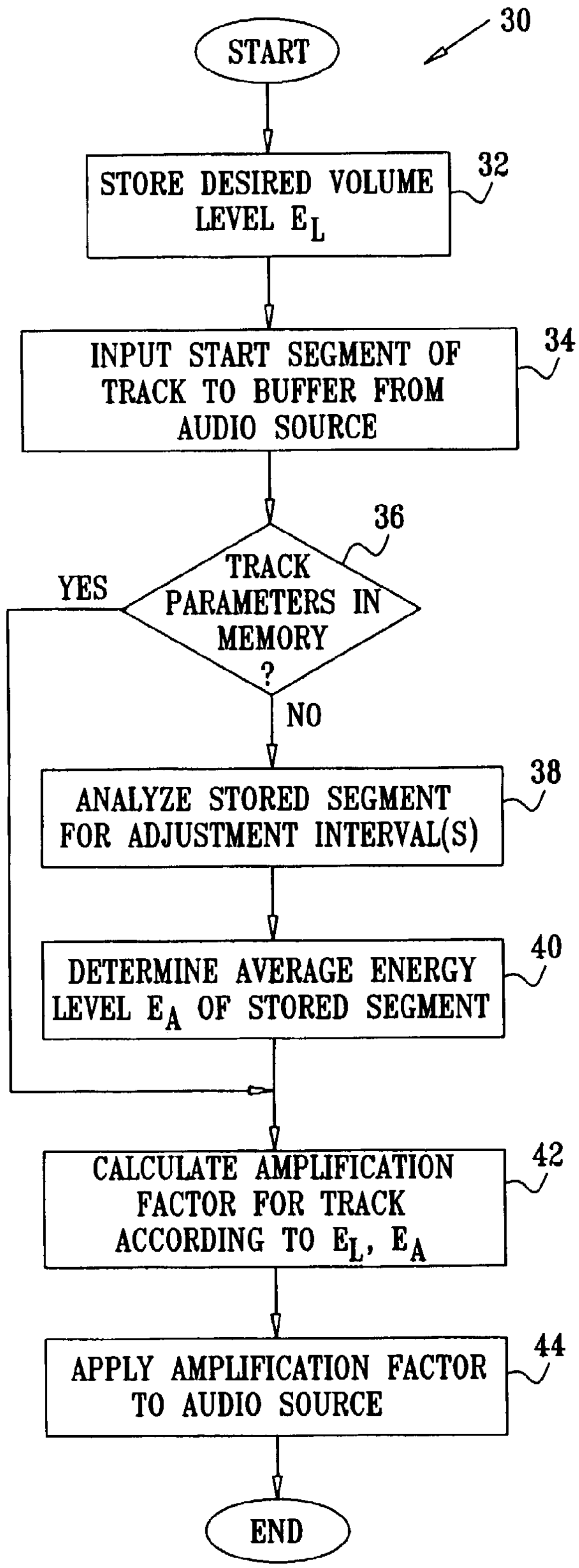
FIG. 2 is a flowchart showing steps of a process followed by the sound system as a sound card begins to receive audio data from a digital audio source, according to a preferred embodiment of the present invention.

FIG. 2 is a flowchart showing steps of a process 30 followed by system 10 as sound card 16 begins to receive audio data from DAS 12, according to a preferred embodiment of the present invention. In an initial step 32, an operator of system 10 stores a volume level, $E_L$, in memory 24. The stored volume level is the level at which the operator desires to hear the audio output from DAS 12. The operator also stores a type of the track which is being played, the type governing, as is described in more detail below, a volume variation which may be applied to the track. Types include, but are not limited to, music, song, speech, and combinations of these and other sounds.

In a first playing step 34, DAS 12 begins to output a data stream, which has been recorded on the DAS, to sound card 16. By way of example, the data stream is assumed to be from a specific "track" of music which has been recorded on the DAS, although it will be understood that the term track is used herein to represent any pre-recorded audio data source comprising the types described above. The data source may be recorded in any industry standard format for analog or digital data, or may be in a custom format for such data. An initial segment of the audio data stream from the specific track, preferably a segment equivalent to approximately 24 s or more of playing time, is stored in buffer 18. Alternatively, any other time may be used. If the source comprises an analog source, output from the analog source is sampled and digitized in ADC 26 prior to storage in buffer 18.

In a condition step 36, processor 20 checks to see if parameters of the track, including an energy level, $E_A$, the evaluation of which are described in more detail below with respect to steps 38 and 40, have been previously stored in memory 24. If the energy level, $E_A$, is in the memory, processor 20 uses the stored value and continues to step 42. If $E_A$ is not in memory 24, process 30 continues at a first analysis step 38.

In first analysis step 38, processor 20 analyzes the data stored in buffer 18 to determine one or more adjustment intervals comprised within the data. An adjustment interval is herein assumed to comprise an interval of a track where an amplification factor applied to data in the interval can be changed without causing a change in output volume level that would be noticeable and bothersome to listeners. For example, an interval of comparative silence, such as may be found within a track comprising speech, corresponds to an adjustment interval. Other examples of the occurrence of adjustment intervals within a track are described below. It will be understood that a complete track comprises an initial adjustment interval at the beginning of the track, and a final adjustment interval at the end of the track. It will also be appreciated that for a single track comprising music, adjustment intervals apart from the initial and final intervals are typically comparatively rare. As described in more detail below, the adjustment intervals are used to define bounds of sections of the track that are used to calculate an average energy of the track, the sections excluding the adjustment intervals.

In a preferred embodiment of the present invention, adjustment intervals in the initial segment are determined by finding an average energy level of all data in the buffer, substantially as described with respect to equation (1) below. An adjustment interval is then defined to be an interval wherein the energy level of the interval is a pre-set value, such as 10 dB, below the unadjusted average energy level.

$$E_U = \frac{1}{n}\sum_{i=1}^{n} s_i^2 \quad (1)$$

where $E_U$ is an unadjusted average of all points n stored in buffer 18;

n is the number of points of stored data in buffer 18; and $s_i$ is the amplitude of each point.

Alternatively or additionally, adjustment intervals can be taken to be the intervals between tracks, or intervals identified by the operator. Processor 20 stores the position of each adjustment interval in memory 24, as a track parameter that the processor is able to use in a future playing of the track.

In a second analysis step 40, processor 20 determines an adjusted average energy level, $E_A$, of the stored data. The method of determination depends on the number and placement of adjustment intervals found in the first analysis step. If only one interval has been found, such as is typically the case when the data source is a music track and the interval is the initial adjustment interval at the beginning of the track, then the average energy level is determined according to equation (2):

$$E_A = \frac{1}{n}\sum_{i=1}^{n} s_i^2 \quad (2)$$

where n is the number of points in buffer 18 not in the adjustment interval; and $s_i$ is the amplitude of each point.

If more than one adjustment interval has been found, then equation (2) is applied to each section of data not comprising the adjustment intervals, and $E_A$ is determined according to equation (3):

$$E_A = \frac{\sum_N \left(\frac{1}{n}\sum_{i=1}^{n} s_i^2\right)}{N} \quad (3)$$

where n and $s_i$ are as defined in equation (2) for each section; and

N is the number of sections generated by the adjustment intervals acting as boundaries.

Tracks where more than one adjustment interval may occur include speech or advertisement audio sources, where the adjustment intervals typically correspond to intervals of relative quiet in the track. The value of $E_A$ is stored in memory 24.

In a gain-setting step 42, processor 20 uses the value of $E_A$, and of the stored volume level, $E_L$, to compute an initial amplification factor, $G(E_A, E_L)$, as a function of $E_A$ and $E_L$, to be applied to the audio data from the specific track. Preferably, $G(E_A, E_L)$ comprises a function of a ratio $$\frac{E_L}{E_A},$$

such as $$\left(\frac{E_L}{E_A}\right)^{\frac{1}{2}}.$$

Alternatively, the amplification factor is any other function of $E_A$ and $E_L$. The initial amplification factor, $G(E_A,E_L)$, is such that when applied to data from the track, the track is heard at a level substantially equal to $E_A$. It will be appreciated that the amplification factor may be computed analytically, or may be evaluated by any other means known in the art, such as by using a look-up table.

In an output step 44, processor 20 multiplies the audio data $s_i$ from the initial segment and from the remainder of the track by the amplification factor, $G(E_A, E_L)$. The multiplied values are transferred to DAC 29, and the analog result from the DAC is output to loudspeakers 22. It will be understood that process 30 generates an amplification factor from the initial segment, and that the amplification factor is applied in a look-ahead manner to the remainder of the track, so acting as a constant amplification factor for substantially the whole track.

Figure 3:
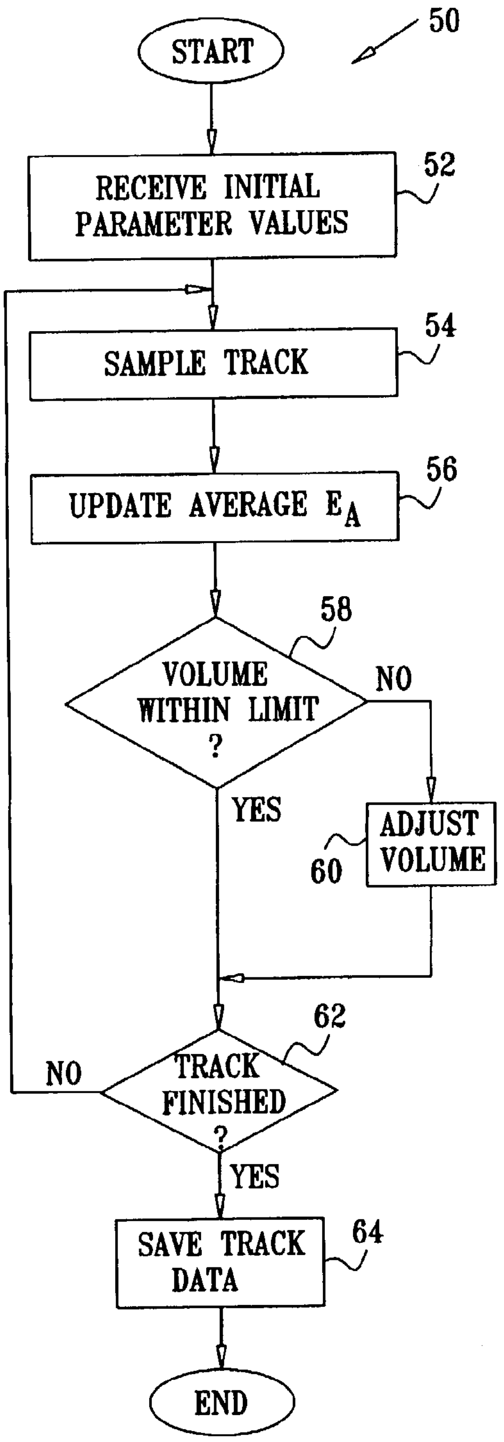
FIG. 3 is a flowchart showing steps of a process that may be followed by the sound system as the sound card continues to receive audio data from the digital audio source, according to a preferred embodiment of the present invention.

FIG. 3 is a flowchart showing steps of a process 50 which may be followed by system 10 as sound card 16 continues to receive audio data from DAS 12, according to a preferred embodiment of the present invention. When implemented, process 50 is applied after process 30, preferably for the duration of playing of the audio data. In a first step 52, processor 20 reads the values of $E_L$ and $E_A$ from memory 24, and also reads the type of track. In a sample track step 54, processor 20 samples the track, after the initial segment analyzed in process 30. Preferably, the sampling is performed by sequentially reading segments after the initial segment into buffer 18, before they are played out of the buffer.

In an update step 56, processor 20 checks for adjustment intervals in the segment stored in buffer 18. Positions of adjustment intervals of the track are stored in memory 24 for future use. Also, processor 20 uses the data stored in the buffer to update the value of $E_A$, so that $E_A$ is the adjusted cumulative average energy value of all data, apart from data in adjustment intervals, that has been read from the track into the buffer.

In a volume evaluation condition 58, processor 20 checks that $E_A$ is approximately equal to $E_L$, i.e., is within a predetermined limit of $E_L$ set by the system operator. The limit is most preferably set according to the type of track being played, most preferably the limit for a music track being set to be less than the limit for other types of tracks. Most preferably, the limit is of the order of 10 dB. If $E_A$ is outside the limit, then in an adjustment step 60 processor 20 changes the initial amplification factor $G(E_A,E_L)$, most preferably during playing of an adjustment interval of the track. The rate of change that processor 20 is able to make in step 60 is most preferably set according to the type of track being played. Typically, for music tracks, the allowed rate of change is relatively small, of the order of 1 dB/s, whereas for speech tracks such as advertising, the allowed rate of change is larger, of the order of 3 dB/s.

In a condition step 62 the processor checks to see if the track being played has finished. If audio data remains, the process as described above repeats for further track segments, until the track completes, at which point the final value of $E_A$ and positions of the adjustment intervals of the track are saved in memory 24 in a save data step 64, for use in a future playing of the track.

It will be understood that process 30, and process 50 when it is used, comprise steps used when a single track is played through sound card 28, for example, when the specific track from DAS 12 is played after a track that has been playing from DAS 14 has completed.

If two tracks are played sequentially, with a period of silence between the tracks, there will generally be different amplification factors for each of the tracks, depending on original levels at which the tracks were recorded. It will also be appreciated that the amplification factor for the second track is based on the process 30 analysis of the initial segment of the second track. If the calculated second track amplification factor is less than the first track amplification factor, then the second track amplification factor is preferably applied to the second track immediately, substantially as described for step 44 of process 30. If the calculated second track amplification factor is greater than the first track amplification factor, and if the energy level $E_A$ Of the track has not been previously stored in memory 24, then the second track amplification factor is preferably applied to the second track after a delay of up to approximately 200 ms, to ensure that there is no necessity for reduction in the second track amplification factor as the second track is played.

Figure 4:
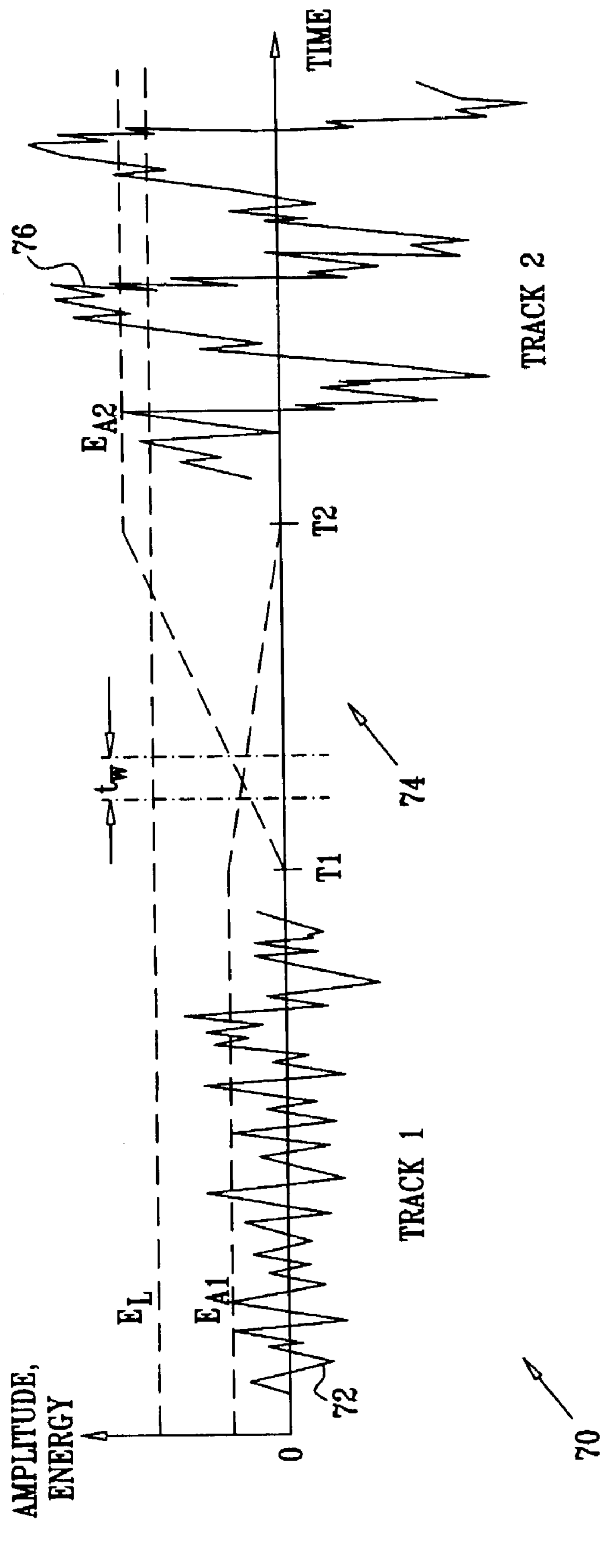
FIG. 4 is a schematic graph illustrating parameters used when two tracks are mixed, according to a preferred embodiment of the present invention.

FIG. 4 is a schematic graph 70 illustrating parameters used when two tracks are mixed, according to a preferred embodiment of the present invention. The two separate tracks, as well as a mixed portion of the tracks, are to be played at a substantially constant volume level equivalent to $E_L$. A graph 72 represents audio output from a first track, assumed to be from DAS 12, before the output is processed through system 10. The first track is assumed to have an average energy represented by $E_{A1}$, as determined by process 30, and process 50 if it is applied (FIGS. 2 and 3). By way of example $E_{A1}$ is assumed to be less than $E_L$, so that an amplification factor $G_1$, greater than 1, is applied to the audio output to generate an adjusted audio output having an adjusted average energy of $E_L$. For clarity, the adjusted audio output, i.e., the output of system 10 that is played through loudspeakers 22, is not shown in graph 70.

At a time T1, during playing of the first track, a second track, assumed to be from DAS 14, starts to be mixed with the first track. The mixing is assumed to continue for a period 74, ending at a time T2, when the second track plays alone. A graph 76 represents audio output from the second track, assumed to be from DAS 14, before the output is played through system 10. The second track is assumed to have an average energy represented by $E_{A2}$, as determined by process 30. By way of example $E_{A2}$ is assumed to be greater than $E_L$, so that an amplification factor $G_2$, less than 1, is applied to the second track's audio output to generate an adjusted audio output having an adjusted average energy of $E_L$.

During period 74 amplification factor $G_1$ is altered, so that by time T2 the value of $G_1$ applied to the first track is effectively zero. The varying value of $G_1$ is herein represented by $G_1(t)$, where T1 $\leqq t \leqq$ T2. Similarly, during period 74 amplification factor $G_2$ is increased from a value of zero at time T1 to $G_2$ at time T2 , and the varying value of $G_2$ is represented by $G_2(t)$. The values of $G_1(t)$ and $G_2(t)$ are changed so that during period 74 the mixed level of the summed audio output, after each track has been adjusted by the respective varying amplification factors $G_1(t)$ and $G_2(t)$, is substantially equal to $E_L$. For clarity, the mixed audio output of the summed first and second tracks is not shown during period 74. Most preferably, during period 74 processor 20 calculates a moving average of the summed audio output, during a moving window of time $t_w$, $t_w$<T2-T1, where $t_w$ is pre-set by the system operator, and is preferably of the order of 200 ms. The function of the moving average is described in more detail below with respect to FIG. 5.

Figure 5:
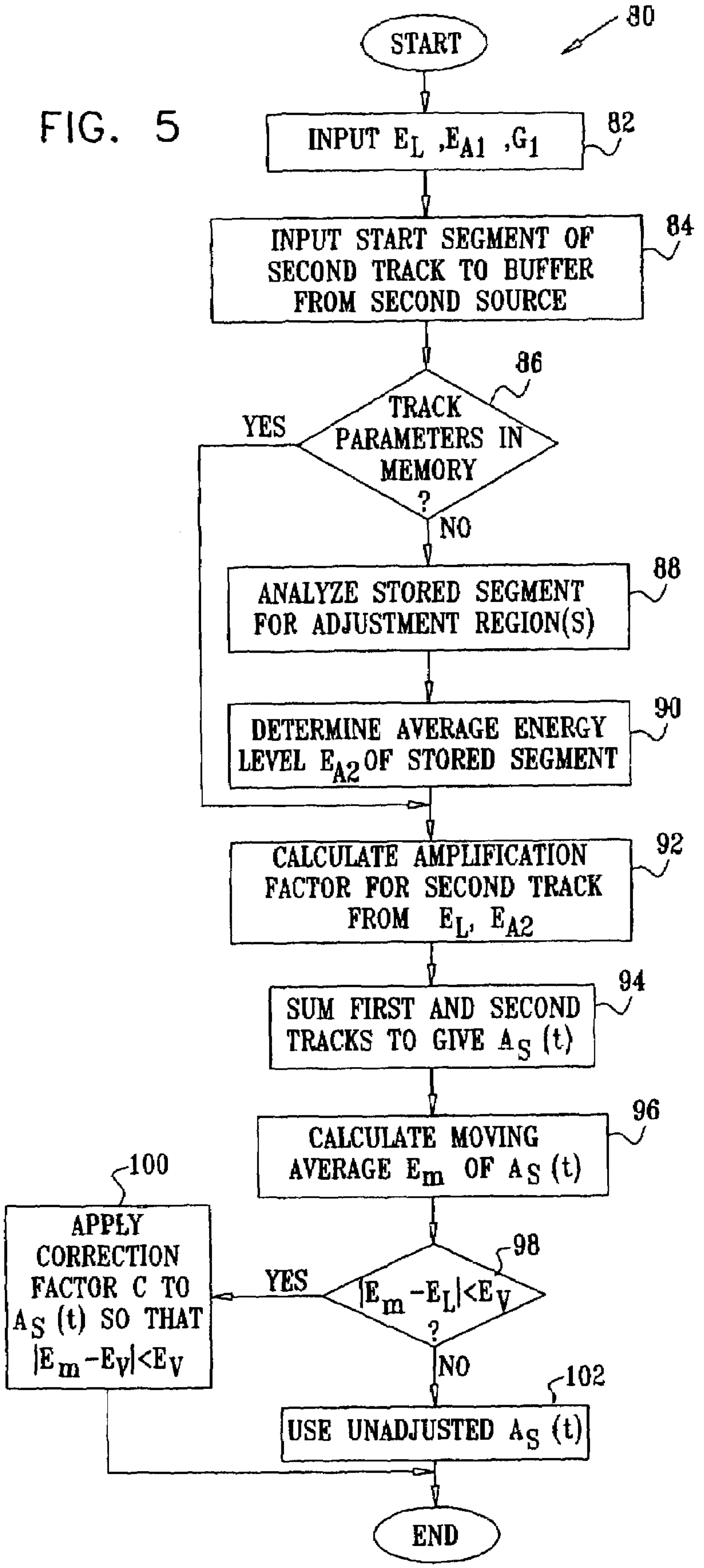
FIG. 5 is a flowchart showing steps in a mixing process followed by the sound system as the sound card receives audio data from more than one track, according to a preferred embodiment of the present invention.

FIG. 5 is a flowchart showing steps in a mixing process 80 followed by system 10 as sound card 16 receives audio data from more than one track, according to a preferred embodiment of the present invention. Process 80 implements the mixing of two tracks, as illustrated in FIG. 4, the first track having average energy $E_{A1}$ and amplification factor $G_1$. Before the first track finishes the second track is to be mixed with the first track. Process 80 is implemented when the system operator requires the volume levels, from the first track alone, during mixing of the tracks, and from the second track alone, to be substantially constant and determined by the volume level $E_L$ in memory 24. Typically, process 80 will be initiated by the system operator towards the end of the first track.

As described with reference to FIG. 4, it will be understood that process 80 requires two amplification factors, $G_1$ and $G_2$, to be applied respectively to the first and the second track when the tracks are not mixed. During the mixing $G_1$ and $G_2$ are varied, as $G_1(t)$ and $G_2(t)$, so that as the volume level of the first track decreases, the volume level of the second track increases.

In a first step 82, processor 20 reads the values of $E_L$, $E_{A1}$, and $G_1$. In addition, the system operator sets parameters to be applied to the mixing of the tracks, such as a period of time corresponding to period 74 (FIG. 4) for the mixing to be applied, and a type of mixing. Most preferably, the type of mixing is linear, wherein the average energy level of the first track decreases linearly from $E_L$ to zero over the period of time set by the system operator, and the average level of the second track increases linearly from zero to $E_L$ over the same period. Alternatively, any other type of mixing known in the art, such as exponential or logarithmic mixing, may be selected.

Steps 84, 86, 88, 90, and 92 are applied to the data from the second track, operations performed in the steps being generally respectively as described above for steps 34, 36, 38, 40, and 42 (FIG. 2). Thus, in step 84 an initial segment from the second track is input to buffer 18, and in steps 86, 88, and 90 an average energy $E_{A2}$ of the second track is determined. In step 92 processor 20 calculates the required amplification factor $G_2$ which will be applied to data from the second track.

In a first summation step 94, processor 20 generates summed data from both the first and the second track, according to the type of mixing selected in step 82, so that a summed energy of the two tracks is nominally equal to $E_L$. Thus, for linear mixing, at any elapsed time t, T1$\leqq t \leqq$T2, during the mixing, $G_1(t)$ and $G_2(t)$ are given by equations (4):

$$G_1(t) = G_1 \cdot \left(\frac{T2 - t}{T2 - T1}\right); \quad G_2(t) = G_2 \cdot \left(\frac{t - T1}{T2 - T1}\right) \tag{4}$$

Expressions for $G_1(t)$ and $G_2(t)$, comprising mixing factors that a function of the elapsed time and that are applied to $G_1$ and $G_2$ respectively, for types of mixing other than linear, will be apparent to those skilled in the art.

A value of a summed amplitude $A_S(t)$ of the mixed data is given by equation (5):

$$A_S(t)=G_1(t)\cdot s_{i1}+G_2(t)\cdot s_{i2} \tag{5}$$

where $s_{i1}$ and $si_2$ are respective amplitudes of audio data from the first and second tracks during the mixing period.

In a second summation step 96, the value of $A_S(t)$ is checked for interference effects. It will be understood that the summation of equation (5) may lead to constructive interference effects where a volume output from loudspeakers 22 is unusually large, or destructive interference effects where the volume output is unusually small. Such interference effects are often heard as beating that occurs during the mixing. In step 96, as values for $A_S(t)$ are generated, processor 20 calculates a moving average energy $E_m$ of a set of $A_S(t)$, the set comprising values of $A_S(t)$ generated within the moving window of time $t_w$.

In a comparison step 98, the value of $E_m$ is compared with $E_L$ at times when $t_w$ does not correspond with an adjustment interval, determined in steps 38 and 88 (FIGS. 2 and 4), of the first or the second track. If $|E_m-E_L|<E_V$, where $E_V$ is an allowed variation of $E_m$ set by the system operator, in a step 102 $A_S(t)$ is used as an input to loudspeakers 22. Preferably, $E_V$ is of the order of 3 dB. If $|E_m-E_L|\geqq E_V$, then in an adjustment step 100 the values of $A_S(t)$ are corrected by multiplying them by a correction factor C, pre-set by the system operator, so that the corrected values of $A_S(t)$ give a value of $E_m$ so that $|E_m-E_L|<E_V$. The corrected values of $A_S(t)$ are then used as the input to loudspeakers 22, and process 80 completes. Process 50 (FIG. 3) is then applied for playing the second track.

It will be appreciated that in addition to the processes described above with respect to FIGS. 2-5, system 10 is able to calibrate the quality of amplification of sound card 16 and correct for any distortion in the amplification. Such a calibration may be performed, for example, by storing known audio data in memory 24, processing the data through the sound card to the input of DAC 29, and noting differences between the stored data and the data input to the DAC. Processor 20 is then implemented to apply a correction factor to the amplification factors calculated in processes 30, 50, and 80, so as to substantially negate the differences and thus correct the distortion.

It will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A method for generating an audio output from an audio amplifier, the method comprising:
- receiving a segment of an input audio data stream into a buffer;
- while the segment is in the buffer:
  - identifying an adjustment interval in the segment, the adjustment interval comprising a silent interval;
  - calculating an average energy of at least a section of the segment subsequent to the adjustment interval; and
  - determining a constant amplification factor in response to the average energy and to a pre-set volume level of the audio output;
- outputting the segment from the buffer to the audio amplifier; and
- when the segment output to the audio amplifier reaches the adjustment interval, adjusting the audio amplifier to apply the amplification factor in a look-ahead manner to a remainder of the input audio data stream subsequent to the adjustment interval.

2. A method according to claim 1, and comprising while the segment is in the buffer calculating an unadjusted average energy of the segment, and wherein the adjustment interval comprises an interval of the input audio data stream of the segment having a pre-set value below the unadjusted average energy level.

3. A method according to claim 1, wherein the adjustment interval comprises an interval identified by an operator of the audio amplifier.

4. A method according to claim 1, wherein calculating the average energy comprises summing squares of amplitudes of the input audio data stream.

5. A method according to claim 1, and comprising while the segment is in the buffer identifying one or more other adjustment intervals in the segment other than the adjustment interval, and wherein calculating the average energy comprises calculating the average energy of the input audio data stream in the segment absent values of the input audio data stream comprised in the adjustment interval and the one or more other adjustment intervals.

6. A method according to claim 1, and comprising:
- receiving one or more subsequent segments of the input audio data stream into the buffer; and
- while the one or more subsequent segments are in the buffer:
  - calculating a cumulative average energy of the input audio data stream in response to the average energy of the at least the section of the segment and an energy of the one or more subsequent segments; and
  - determining an adjustment to the constant amplification factor in response to the cumulative average energy.

7. A method according to claim 6, and comprising identifying one or more other adjustment intervals in the one or more subsequent segments, wherein adjusting the audio amplifier comprises, when the audio data output to the audio amplifier reaches the one or more other adjustment intervals, applying the adjustment to the constant amplification factor to the audio amplifier.

8. A method according to claim 7, wherein applying the adjustment comprises setting a predetermined limit to a variation from the pre-set volume level, and applying the adjustment in response to exceeding the limit.

9. A method according to claim 8, wherein setting the predetermined limit comprises selecting a type of the input audio data stream from a group of types of audio data comprising music, song, and speech, and setting a value of the predetermined limit in response to the type.

10. A method according to claim 1, and comprising saving the average energy and a position of the adjustment interval in a memory, and wherein the method comprises reading the average energy and the position from the memory and generating a subsequent audio output from the audio amplifier in response to the average energy and the position read from the memory.

11. A method according to claim 1, wherein the adjustment interval comprises an interval at the beginning of the input audio data stream.

12. A method according to claim 1, wherein the input audio data stream is generated by an audio source, and wherein the segment output is provided to one or more loudspeakers, and wherein at least one of the audio source and the one or more loudspeakers are coupled to the audio amplifier by a network.

13. A method for generating an audio output from an audio amplifier, the method comprising:

receiving a first segment of a first input audio data stream into a buffer;

while the first segment is in the buffer:

identifying a first silent interval in the first segment;

calculating a first average energy of at least a section of the first segment subsequent to the first silent interval;

determining a first constant amplification factor in response to the first average energy and to a pre-set volume level of the audio output;

outputting the first segment from the buffer to the audio amplifier;

when the first segment output to the audio amplifier reaches the first silent interval, adjusting the audio amplifier to apply the first amplification factor in a look-ahead manner to a remainder of the first input audio data stream subsequent to the first silent interval;

receiving a second segment of a second input audio data stream into the buffer;

while the second segment is in the buffer:

identifying a second silent interval in the second segment;

calculating a second average energy of at least a section of the second segment subsequent to the second silent interval;

determining a second constant amplification factor in response to the second average energy and to the pre-set volume level;

outputting the second segment from the buffer to the audio amplifier; and adjusting the audio amplifier to apply the first amplification factor to the first input audio data stream and the second amplification factor to the second input audio data stream so as to generate a mixed output of the first and the second audio data streams having a mixed level substantially equal to the pre-set volume level.

14. A method according to claim 13, wherein adjusting the audio amplifier to apply the first amplification factor to the first input audio data stream and the second amplification factor to the second input audio data stream comprises:

selecting a time interval in which to generate the mixed output;

setting a first mixing factor and a second mixing factor, for the first and second input audio data stream respectively, in response to an elapsed time in the time interval; and multiplying the first amplification factor by the first mixing factor and multiplying the second amplification factor by the second mixing factor.

15. A method according to claim 13, wherein adjusting the audio amplifier to apply the first amplification factor to the first input audio data stream and the second amplification factor to the second input audio data stream comprises: measuring the mixed level to determine an interference effect between the first input audio data stream and the second input audio data stream; and altering an overall gain of the audio amplifier to correct for the interference effect.

16. Apparatus for generating an audio output from an audio amplifier, comprising:

a buffer which receives a segment of an input audio data stream; and a processor which is adapted to:

while the segment is in the buffer:

identify an adjustment interval in the segment, the adjustment interval comprising a silent interval, calculate an average energy of at least a section of the segment subsequent to the adjustment interval, and determine a constant amplification factor in response to the average energy and to a pre-set volume level of the audio output, output the segment from the buffer to the audio amplifier, and when the segment output to the audio amplifier reaches the adjustment interval, adjust the audio amplifier to apply the amplification factor in a look-ahead manner to a remainder of the input audio data stream subsequent to the adjustment interval.

17. Apparatus according to claim 16, wherein the processor is adapted while the segment is in the buffer to calculate an unadjusted average energy of the segment, and wherein the adjustment interval comprises an interval of the input audio data stream of the segment having a pre-set value below the unadjusted average energy level.

18. Apparatus according to claim 16, wherein the adjustment interval comprises an interval identified by an operator of the audio amplifier.

19. Apparatus according to claim 16, wherein calculating the average energy comprises summing squares of amplitudes of the input audio data stream.

20. Apparatus according to claim 16, wherein the processor is adapted to identify while the segment is in the buffer one or more other adjustment intervals in the segment other than the adjustment interval, and wherein calculating the average energy comprises calculating the average energy of the input audio data stream in the segment absent values of the input audio data stream comprised in the adjustment interval and the one or more other adjustment intervals.

21. Apparatus according to claim 16, wherein the buffer is adapted to receive one or more subsequent segments of the input audio data stream, and wherein the processor is adapted to:

while the one or more subsequent segments are in the buffer:

calculate a cumulative average energy of the input audio data stream in response to the average energy of the at least the section of the segment and an energy of the one or more subsequent segments, and determine an adjustment to the constant amplification factor in response to the cumulative average energy.

22. Apparatus according to claim 21, and wherein the processor is further adapted to identify one or more other adjustment intervals in the one or more subsequent segments, and wherein adjusting the audio amplifier comprises, when the audio data output to the audio amplifier reaches the one or more other adjustment intervals, applying the adjustment to the constant amplification factor to the audio amplifier.

23. Apparatus according to claim 22, wherein applying the adjustment comprises setting a predetermined limit to a variation from the pre-set volume level, and applying the adjustment in response to exceeding the limit.

24. Apparatus according to claim 23, wherein setting the predetermined limit comprises selecting a type of the input audio data stream from a group of types of audio data comprising music, song, and speech, and setting a value of the predetermined limit in response to the type.

25. Apparatus according to claim 16, and comprising a memory to which the average energy and a position of the adjustment interval are saved, and wherein the processor is adapted to read the average energy and the position from the memory and to generate a subsequent audio output from the audio amplifier in response thereto.

26. Apparatus according to claim 16, wherein the adjustment interval comprises an interval at the beginning of the input audio data stream.

27. Apparatus according to claim 16, wherein the input audio data stream is generated by an audio source, and wherein the segment output is provided to one or more loudspeakers, and wherein at least one of the audio source and the one or more loudspeakers are coupled to the audio amplifier by a network.

28. Apparatus for generating an audio output from an audio amplifier, comprising:

a buffer which receives a first segment of a first input audio data stream; and a processor which is adapted to:

while the first segment is in the buffer:

identify a first silent interval in the first segment, calculate a first average energy of at least a section of the first segment subsequent to the first silent interval, determine a first constant amplification factor in response to the first average energy and to a pre-set volume level of the audio output, output the first segment from the buffer to the audio amplifier, when the first segment output to the audio amplifier reaches the first silent interval, adjust the audio amplifier to apply the first amplification factor in a look-ahead manner to a remainder of the first input audio data stream subsequent to the first silent interval, wherein the buffer is adapted to receive a second segment of a second input audio data stream, and wherein the processor is further adapted to:

while the second segment is in the buffer:

identify a second silent interval in the second segment;

calculate a second average energy of at least a section of the second segment subsequent to the second silent interval, determine a second constant amplification factor in response to the second average energy and to the pre-set volume level, output the second segment from the buffer to the audio amplifier, and adjust the audio amplifier to apply the first amplification factor to the first input audio data stream and the second amplification factor to the second input audio data stream so as to generate a mixed output of the first and the second audio data streams having a mixed level substantially equal to the pre-set volume level.

29. Apparatus according to claim 28, wherein adjusting the audio amplifier to apply the first amplification factor to the first input audio data stream and the second amplification factor to the second input audio data stream comprises:

selecting a time interval in which to generate the mixed output;

setting a first mixing factor and a second mixing factor, for the first and second input audio data stream respectively, in response to an elapsed time in the time interval; and multiplying the first amplification factor by the first mixing factor and multiplying the second amplification factor by the second mixing factor.

30. Apparatus according to claim 28, wherein adjusting the audio amplifier to apply the first amplification factor to the first input audio data stream and the second amplification factor to the second input audio data stream comprises:

measuring the mixed level to determine an interference effect between the first input audio data stream and the second input audio data stream; and altering an overall gain of the audio amplifier to correct for the interference effect.

* * * * *